United States Patent
Moriya et al.

(10) Patent No.: US 10,825,662 B2
(45) Date of Patent: Nov. 3, 2020

(54) METHOD FOR DRIVING MEMBER AND PROCESSING APPARATUS

(71) Applicant: TOKYO ELECTRON LIMITED, Tokyo (JP)

(72) Inventors: Rumiko Moriya, Hillsboro, OR (US); Takanori Banse, Miyagi (JP); Suguru Sato, Miyagi (JP); Yuuji Akiduki, Miyagi (JP); Takehiro Tanikawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/411,559

(22) Filed: May 14, 2019

(65) Prior Publication Data

US 2019/0355557 A1   Nov. 21, 2019

(30) Foreign Application Priority Data

May 15, 2018 (JP) ................. 2018-094089

(51) Int. Cl.
| | |
|---|---|
| *H01J 37/32* | (2006.01) |
| *H01L 21/687* | (2006.01) |
| *G01S 17/08* | (2006.01) |
| *H01J 37/22* | (2006.01) |
| *H01L 21/67* | (2006.01) |
| *G01S 17/06* | (2006.01) |
| *H01L 21/683* | (2006.01) |

(52) U.S. Cl.
CPC ........ *H01J 37/32642* (2013.01); *G01S 17/06* (2013.01); *G01S 17/08* (2013.01); *H01J 37/22* (2013.01); *H01J 37/3299* (2013.01); *H01J 37/32733* (2013.01); *H01L 21/67069* (2013.01); *H01L 21/68735* (2013.01); *H01L 21/68742* (2013.01); *H01J 2237/024* (2013.01); *H01J 2237/21* (2013.01); *H01J 2237/334* (2013.01); *H01J 2237/3343* (2013.01); *H01L 21/6831* (2013.01)

(58) Field of Classification Search
None
See application file for complete search history.

(56) References Cited

U.S. PATENT DOCUMENTS

| | | | |
|---|---|---|---|
| 2008/0236749 A1 | 10/2008 | Koshimizu et al. | |
| 2012/0251705 A1* | 10/2012 | Matsudo | G05D 23/192 427/8 |
| 2018/0315640 A1* | 11/2018 | Ueda | H01L 21/68764 |

FOREIGN PATENT DOCUMENTS

JP   2008-244274 A   10/2008

* cited by examiner

*Primary Examiner* — Jiong-Ping Lu
(74) *Attorney, Agent, or Firm* — Rothwell, Figg, Ernst & Manbeck, P.C.

(57) ABSTRACT

There is provided a method for driving a member provided in a processing chamber. The method includes irradiating to the member measurement light having a wavelength that penetrates the member, detecting intensity distribution of reflected light based on reflected light from an upper surface of the member and reflected light from a bottom surface of the member, calculating an optical path difference by applying Fourier transform to a spectrum indicating the intensity distribution, and determining a driving amount of the member based on the optical path difference. The method further includes driving the member based on the determined driving amount.

16 Claims, 10 Drawing Sheets

METHOD FOR DRIVING MEMBER AND PROCESSING APPARATUS

CROSS-REFERENCE TO RELATED APPLICATIONS

This application claims priority to Japanese Patent Application No. 2018-094089, filed on May 15, 2018, the entire contents of which are incorporated herein by reference.

TECHNICAL FIELD

The present disclosure relates to a method for driving a member and a processing apparatus.

BACKGROUND

In a plasma processing apparatus, an edge ring is disposed along an outer periphery of a wafer (see, e.g., Japanese Patent Application Publication No. 2008-244274). The edge ring is provided to control plasma near the outer periphery of the wafer to improve in-plane uniformity of an etching rate of the wafer.

The etching rate at an edge portion of the wafer varies mainly depending on a sheath above the edge ring. Therefore, when a height of the edge ring is changed due to edge ring consumption, a height of the sheath above the edge ring is changed, which makes it difficult to control etching characteristics such as the etching rate at the edge portion of the wafer. Accordingly, a driving unit for vertically driving the edge ring is provided to control a position of an upper surface of the edge ring and improve the controllability at the edge portion of the wafer.

In view of the above, the present disclosure provides a method for more accurately driving a member.

SUMMARY

In accordance with an embodiment of the present disclosure, there is provided a method for driving a member provided in a processing chamber, comprising: irradiating to the member measurement light having a wavelength that penetrates the member; detecting intensity distribution of reflected light based on reflected light from an upper surface of the member and reflected light from a bottom surface of the member; calculating an optical path difference by applying Fourier transform to a spectrum indicating the intensity distribution; determining a driving amount of the member based on the optical path difference; and driving the member based on the determined driving amount.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described in detail with reference to the accompanying drawings. Like reference numerals will be given to like or corresponding parts throughout the drawings, and redundant description thereof will be omitted.

<Plasma Processing Apparatus>

Figure 1:
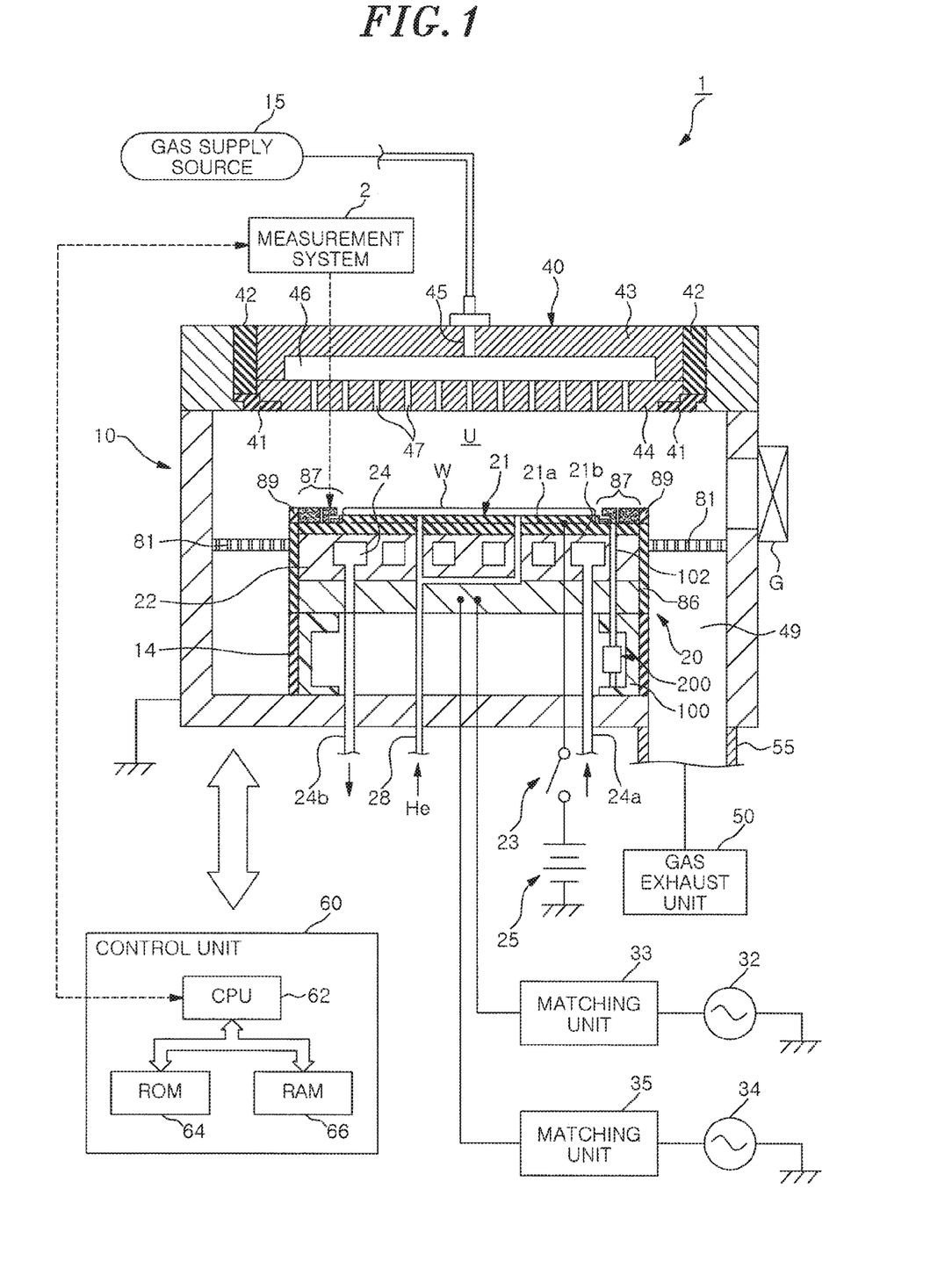
FIG. 1 is a cross-sectional view showing an example of a plasma processing apparatus according to one embodiment.

First, an example of a plasma processing apparatus 1 according to an embodiment will be described with reference to FIG. 1. The plasma processing apparatus 1 according to the embodiment is a parallel-plate capacitively-coupled plasma (CCP) processing apparatus, which is an example of a processing apparatus.

The plasma processing apparatus 1 has a substantially cylindrical processing chamber 10. The processing chamber has an alumite treated (anodically oxidized) inner surface. In the processing chamber 10, plasma processing such as etching, film formation, or the like is performed on a wafer W by plasma.

A mounting table 20 includes a base 22 and an electrostatic chuck 21. The wafer W is mounted on an upper surface of the electrostatic chuck 21. The base 22 is made of, e.g. aluminum (Al), titanium (Ti), silicon carbide (SiC), or the like.

The electrostatic chuck 21 is provided on the base 22. The electrostatic chuck 21 has a structure in which an electrode film 21a is embedded between insulators 21b. A DC power supply 25 is connected to the electrode film 21a through a switch 23. When the switch 23 is on and a DC voltage is applied from the DC power supply 25 to the electrode film 21, the wafer W is attracted to and held on the electrostatic chuck 21 by a Coulomb force. The mounting table 20 may not include the electrostatic chuck 21.

An annular edge ring 87 is arranged to surround a peripheral portion of the wafer W. The edge ring 87 functions to converge plasma toward a surface of the wafer W and to improve the efficiency of plasma processing. The edge ring 87 is divided into three parts made of silicon (Si), for example.

The mounting table 20 is supported at a bottom portion of the processing chamber 10 by a support body 14. A flow path 24 through which a coolant flows is formed in the base 22. A coolant, e.g., cooling water, brine or the like, from a chiller unit circulates in the order of a coolant inlet line 24a, the flow path 24, a coolant outlet line 24b, and the chiller unit. The coolant circulated as described above absorbs heat from the mounting table 20, thereby cooling the mounting table 20. The coolant includes fluid and gas.

A heat transfer gas, e.g., He (helium) gas or the like, from a heat transfer gas supply source passes through a gas supply line 28 and is supplied to a gap between a top surface of the electrostatic chuck 21 and a backside of the wafer W. With this configuration, the wafer W is controlled to a predetermined temperature by the coolant circulating through the flow path 24 and the heat transfer gas supplied to the backside of the wafer W.

A high frequency power supply 32 is connected to the mounting table 20 through a matching unit 33, and applies a high frequency power HF for plasma generation to the mounting table 20. A high frequency power supply 34 is connected to the mounting table 20 through a matching unit 35 and applies a high frequency power LF for bias voltage generation to the mounting table 20. The high frequency power HF has a frequency of, e.g., 40 MHz, and the high frequency power LF has a frequency of, e.g., 13.56 MHz that is lower than the frequency of the high frequency power HF. With this configuration, the mounting table 20 also serves as a lower electrode.

The matching unit 33 is provided to match an output impedance of the high frequency power supply 32 and a load impedance on a plasma side. The matching unit 35 is provided to match an inner impedance of the high frequency power supply 34 and the load impedance on the plasma side.

In the present embodiment, the high frequency power HF is applied to the mounting table 20. However, the high frequency power HF may be applied to an upper electrode 40. The upper electrode 40 is attached to a ceiling portion of the processing chamber 10 to block the ceiling portion through a cylindrical shield ring 42 provided at an outer periphery thereof. The upper electrode 40 has a ceiling plate 44 and a holding member 43. The ceiling plate 44 has conductivity and is made of, e.g., silicon or quartz. The holding member 43 detachably holds the ceiling plate 44. The holding member 43 is made of, e.g., silicon or quartz. In other words, the ceiling plate 44 and the holding member 43 are made of a material, e.g., silicon, quartz or the like, through which a wavelength of measurement light penetrates. A diffusion space 46 is formed in the holding member 43.

The upper electrode 40 is arranged to be opposite to the mounting table 20 (lower electrode) and also serves as a gas shower head. At the peripheral portion of the upper electrode 40, a top shield ring 41 made of quartz ($SiO_2$) or the like is disposed at a bottom surface of the shield ring 42.

An annular cover ring 89 and an insulator ring 86 are disposed around the peripheral portion of the edge ring 87 and the side surface of the mounting table 20. The cover ring 89 and the insulator ring 86 may be made of quartz.

A gas inlet port 45 is formed at the upper electrode 40. The gas supplied from a gas supply source 15 is diffused into the diffusion space 46 through the gas inlet port 45 and then is introduced into a plasma processing space U in the processing chamber 10 through multiple gas supply holes 47.

A gas exhaust port 55 is formed at a bottom surface of the processing chamber 10. The processing chamber 10 is evacuated and depressurized by a gas exhaust unit 50 connected to the gas exhaust port 55. Accordingly, a pressure in the processing chamber 10 can be maintained at a predetermined vacuum level. A gate valve G is provided at a sidewall of the processing chamber 10. The gate valve G is opened and closed when the wafer W is loaded into and unloaded from the processing chamber 10.

An annular baffle plate 81 is provided at an upper portion of a gas exhaust passage 49 that is formed above the gas exhaust port 55 to partition a plasma processing space U and a gas exhaust space and further rectify the gas.

The plasma processing apparatus 1 includes a control unit 60 for controlling the overall operation of the plasma processing apparatus. The control unit 60 includes a central processing unit (CPU) 62, a read only memory (ROM) 64, and a random access memory (RAM) 66. The CPU 62 executes plasma processing such as etching or the like based on a recipe stored in a storage area such as the RAM 66 or the like. The recipe has information for controlling the plasma processing apparatus under the processing conditions, such as a processing time, a pressure, a high frequency power, various gas flow rates, a temperature in the processing chamber (temperature of the wafer W or the like), a temperature of the coolant, and the like are. The recipe indicating those programs or processing conditions may be stored in a hard disk or a semiconductor memory. Further, the recipe may be set in a predetermined place while being stored in a storage medium, e.g., a CD-ROM, a DVD, or the like, that is readable by a portable computer.

Further, the control unit 60 is connected to a measurement system 2. The measurement system 2 measures a thickness of the edge ring 87 from the upper electrode side, and determines a driving amount of the edge ring 87. The control unit 60 drives the edge ring 87 upward or downward based on the determined driving amount of the edge ring 87. The measurement system 2 will be described later with reference to FIG. 3. The control unit 60 may be a computer.

In the plasma processing apparatus 1 configured as described above, when the plasma processing is performed, the opening/closing of the gate valve G is controlled. Then, the wafer W is loaded into the processing chamber 10 and mounted on the mounting table 20 by raising and lowering lifter pins (not shown) that extend through the mounting table 20 and are brought into contact with the backside of the wafer. A DC voltage is applied from a DC power supply 25 to the electrode film 21a, and the wafer W is attracted to and held on the electrostatic chuck 21.

The gas supply source 15 supplies a processing gas into the processing chamber 10. The high frequency power supply 32 applies the high frequency power HF to the mounting table 20. The high frequency power supply 34 applies the high frequency power LF to the mounting table 20. Therefore, plasma is generated in the plasma processing space U, and plasma processing such as plasma etching or the like is performed on the wafer W by the plasma thus generated.

Upon completion of the plasma processing, a DC voltage whose polarity is opposite to that of the voltage applied at the time of attracting the wafer W is applied from the DC power supply 25 to the electrode film 21a, and charges on the wafer W are neutralized. The processed wafer W is separated from the electrostatic chuck 21 by raising and lowering of the lifter pins that are brought into contact with the backside of the wafer W and is unloaded to the outside of the processing chamber 10 through the gate valve G.

The etching rate at the edge portion of the wafer W varies depending on the height of the edge ring 87. Therefore, if the height of the edge ring 87 is changed by its consumption, the etching rate at the edge portion of the wafer W is changed, which makes it difficult to perform the control of edge portion of the wafer W.

Therefore, the edge ring 87 according to an embodiment can be vertically moved by moving lifter pins 102 by means of a moving mechanism 200 provided in the housing 100 inside the support body 14. Hereinafter, an exemplary configuration of the edge ring 87 will be described in detail.

<Configuration of Edge Ring>
(Edge Ring Divided into Three Parts)

Figure 2:
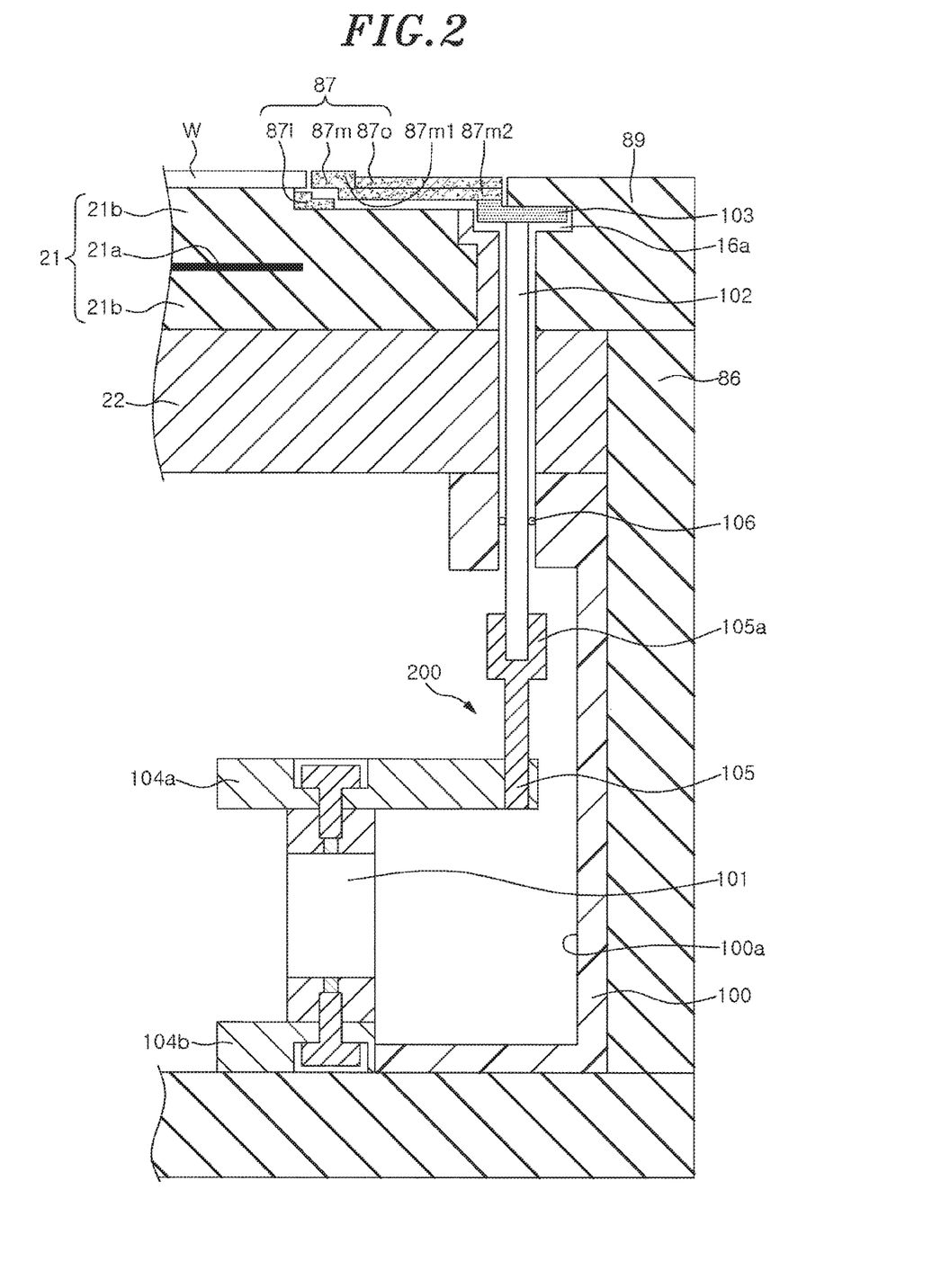
FIG. 2 is an enlarged view of FIG. 1 to show an example of an edge ring divided into three parts.

A configuration of the edge ring 87 divided into three parts according to an embodiment will be described with reference to FIG. 2. FIG. 2 shows an example of the edge ring 87 that is divided into three parts according to the embodiment. The edge ring 87 of the present embodiment includes an inner edge ring 87i, a central edge ring 87m, and an outer edge ring 87o. The inner edge ring 87i is disposed to be closest to the peripheral portion of the wafer W. The inner edge ring 87i is the innermost member of the edge ring 87. The central edge ring 87m is disposed at outer sides of the wafer W and the inner edge ring 87i to surround the wafer W and the inner edge ring 87i. The central edge ring 87m is the central member of the edge ring 87. The outer edge ring 87o is disposed at an outer side of the central edge ring 87m. The outer edge ring 87o is the outermost member of the edge ring 87. In one embodiment, the central edge ring 87m can be vertically moved by the moving mechanism 200, and the inner edge ring 87i and the outer edge ring 87o are fixed to the upper surface of the electrostatic chuck 21.

The central edge ring 87m has an annular portion 87m1 surrounding the peripheral portion of the wafer W and three claw portions 87m2. The claw portions 87m2 are arranged at equal intervals at an outer peripheral side of the annular portion 87m1. Further, the claw portions 87m2 are rectangular members protruding outward from the annular portion 87m1. The annular portion 87m1 has upside down L-shaped longitudinal cross-section and the inner edge ring 87i has an L-shaped longitudinal cross-section. In a state where the step portion of the annular portion 87m1 is making contact with the step portion of the inner edge ring 87i, the step portion of the annular portion 87m1 is separated from the step portion of the inner edge ring 87i when the central edge ring 87m is lifted upward.

(Moving Mechanism and Driving Unit)

The claw portions 87m2 of the central edge ring 87m are connected to a connecting portion 103. The connecting portion 103 vertically moves in a space 16a provided between the electrostatic chuck 21 and the cover ring 89. The housing 100 is made of an insulator such as alumina or the like. The moving mechanism 200 is disposed in a recess portion 100a formed inside the housing 100.

The edge ring 87 is connected to a piezoelectric actuator 101 through the moving mechanism 200. The moving mechanism 200 is configured to vertically move the central edge ring 87m, and includes a lifter pin 102 and a bearing portion 105. The moving mechanism 200 is installed in the housing 100 disposed at an outer periphery of the bottom surface of the mounting table 20 and is vertically moved by the power of the piezoelectric actuator 101. The lifter pin 102 may be made of sapphire.

The lifter pin 102 extends through a pin hole which penetrates the housing 100 and the mounting table 20 and is connected with the bottom surface of the connecting portion 103. The bearing portion 105 is coupled with a member 104a provided inside the housing 100. An O-ring 106 is provided at the pin hole to separate a vacuum space and an atmospheric space.

A lower end of the lifter pin 102 is fitted into a recess portion 105a formed at a leading end of the bearing portion 105. When the bearing portion 105 is vertically moved through the member 104a by the positioning performed by the piezoelectric actuator 101, the lifter pin 102 is vertically moved, thereby raising or lowering the bottom surface of the connecting portion 103. Accordingly, the connecting portion 103 is vertically moved in the space 16a, and the central edge ring 87m is vertically moved.

The piezoelectric actuator 101 is a positioning element utilizing a piezoelectric effect and can perform the positioning with a resolution of 0.006 mm (6 μm). The lifter pin 102 is vertically moved depending on the vertical displacement of the piezoelectric actuator 101. Accordingly, the center edge ring 87m is moved by a predetermined height with 0.006 mm as the minimum unit.

In one embodiment, three lifter pins 102 are disposed at three locations at equal intervals to correspond to the three claw portions 87m2 disposed at three locations at equal intervals in a circumferential direction of the central edge ring 87m. Further, three piezoelectric actuators 101 are provided in one-to-one correspondence with the three lifter pins 102. The members 104a and 104b are annular members. The three piezoelectric actuators 101 are fixed to the housing 100 whiling being disposed between the members 104a and 104b that are vertically fixed by screws. With this configuration, the central edge ring 87m is lifted upward at the three locations to a predetermined height by the lifter pins 102 through the annular connecting portion 103. The piezoelectric actuator 101 of the present embodiment is an example of a driving unit.

Recesses are formed on the bottom surface of the outer edge ring 87o at positions correspond to the claw portion 87m2. When the center edge ring 87m is raised by the upward movement of the lifter pins 102, the claw portions 87m2 are accommodated in the recesses. Accordingly, the central edge ring 87m can be raised in a state where the outer edge ring 87o is fixed.

As described above, in this configuration, the mounting table 20 and the electrostatic chuck 21 are supported by the housing 100, and the moving mechanism 200 and the driving unit are installed in the housing 100. Accordingly, it is possible to vertically move the central edge ring 87m using the conventional electrostatic chuck 21 without changing a design of the electrostatic chuck 21.

As shown in FIG. 2, in the present embodiment, a predetermined space is provided between the upper surface of the electrostatic chuck 21 and the bottom surface of the central edge ring 87m such that the central edge ring 87m can be moved not only in the upward direction but also in the downward direction. Therefore, the central edge ring 87m can be moved upward and downward by a predetermined height within the predetermined space. By moving the central edge ring 87m upward and downward, the control range of the sheath can be expanded.

However, the driving unit is not limited to the piezoelectric actuator 101, and there may be used a motor capable of controlling the positioning with a resolution of 0.006 mm. In addition, a single driving unit or a plurality of driving units may be used. Further, the driving units may share a motor for vertically moving the lifter pins for vertically moving the wafer W. In that case, a mechanism for switching the power of the motor by using a gear and a power switching unit is required to transmit the power to either the lifter pins for the wafer W or the lifter pins 102 for the central edge ring 87m, and a mechanism for controlling the vertical movement of the lifter pins 102 with a resolution of 0.006 mm is required. However, since the central edge ring 87m disposed at the outer periphery of a 300 mm wafer W has a large diameter of about 310 mm, it is preferable to provide an individual driving unit for each lifter pin 102 as described in the present embodiment.

The control unit 60 may control the positioning of the piezoelectric actuators 101 such that the vertical displacement of the piezoelectric actuators 101 depends on the consumption amount of the central edge ring 87m. Alternatively, the control unit 60 may control the vertical displacement of the piezoelectric actuator 101 regardless of the consumption amount of the central edge ring 87m such that the central edge ring 87m is vertically moved to a height at which a desired etching rate can be obtained.

When the height of the upper surface of the wafer W and the height of the upper surface of the edge ring 87 are the same, the height of the sheath above the wafer W and the height of the sheath above the edge ring 87 become the same during the etching process. By controlling the heights of the sheaths to be the same, it is possible to improve the in-plane uniformity of the etching rate of the wafer W and enhance the controllability of the etching characteristics at the edge portion of the wafer W.

<Measurement System>

Figure 3:
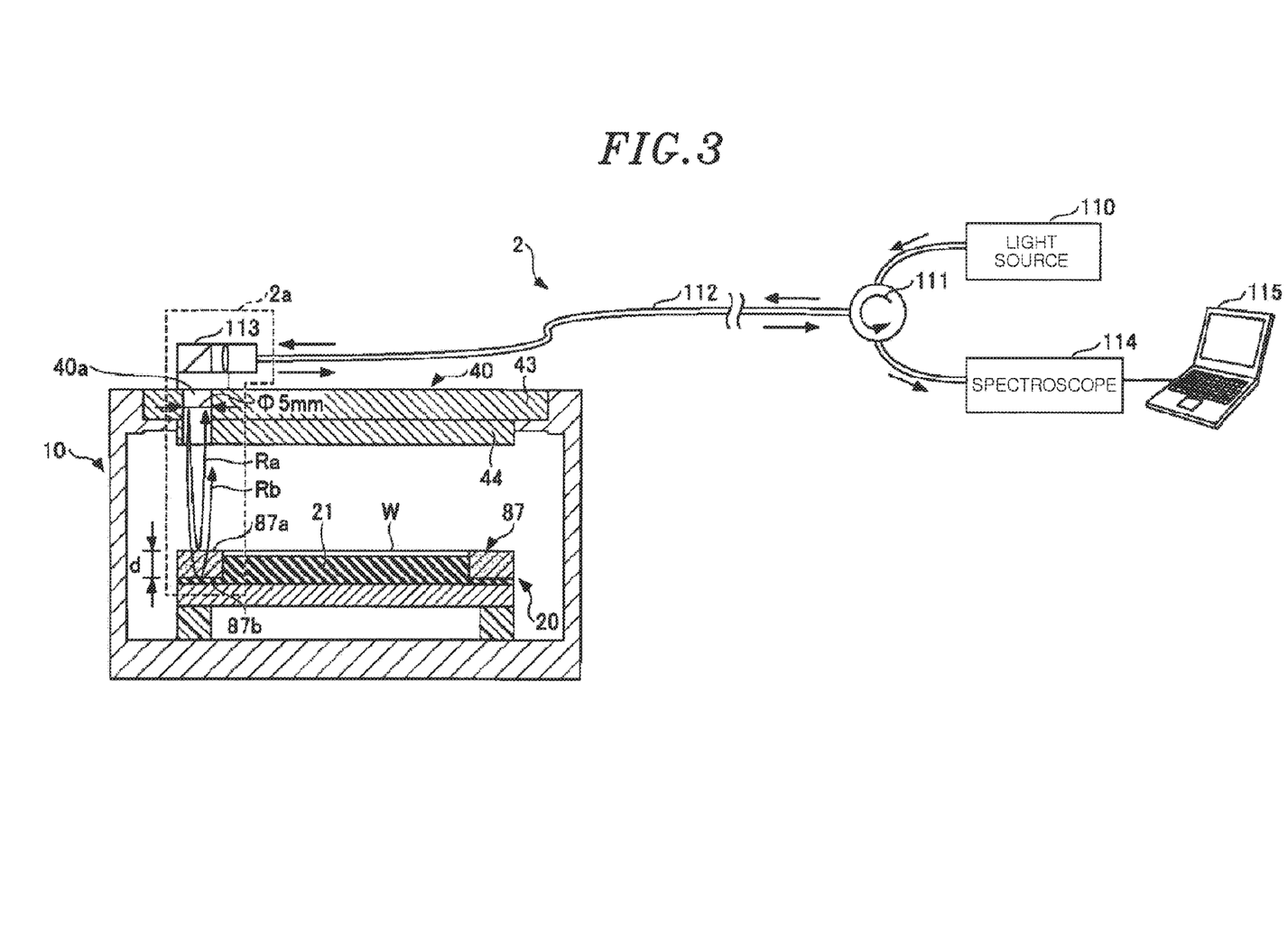
FIG. 3 shows an exemplary measurement system according to one embodiment.
Figure 4:
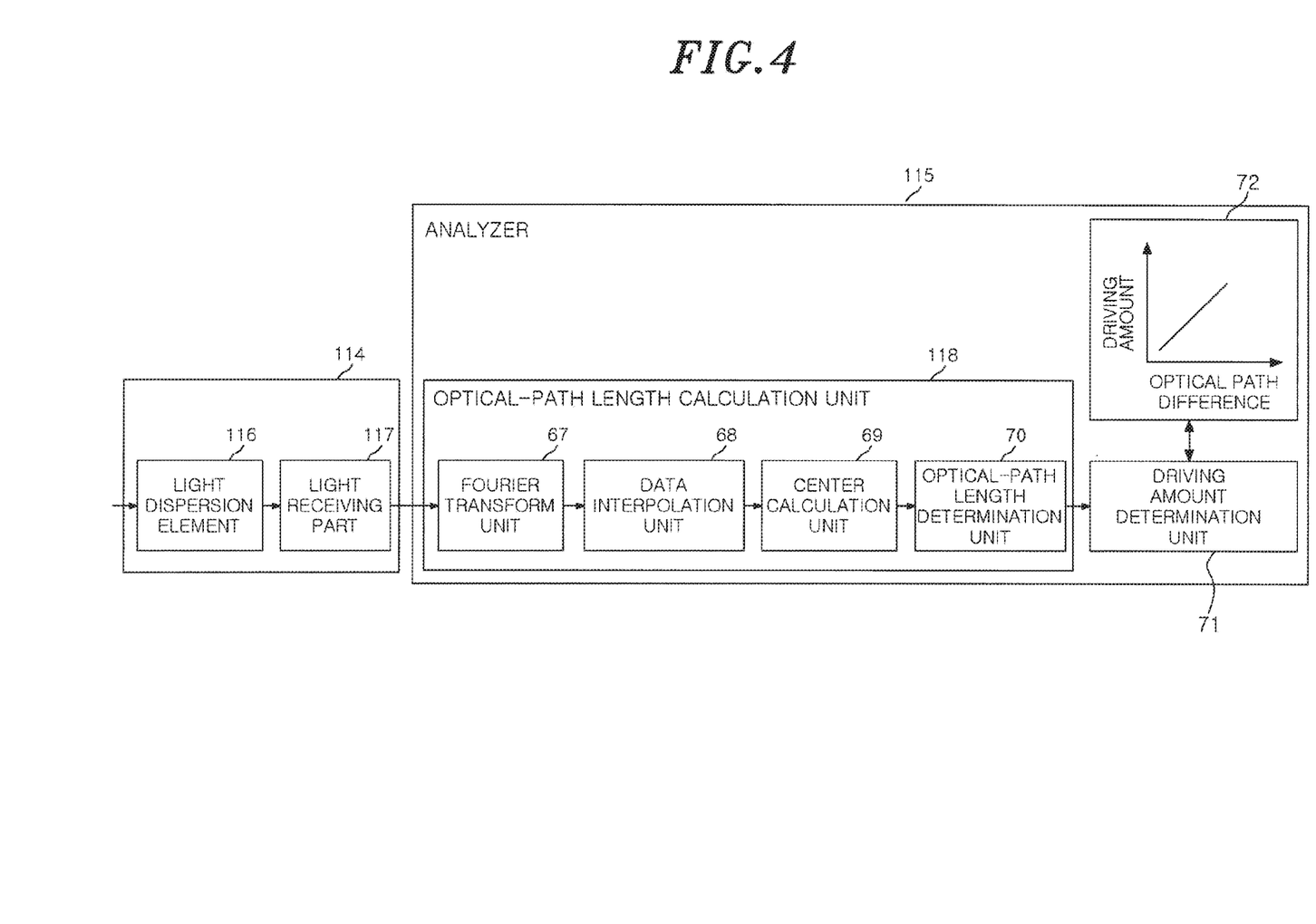
FIG. 4 explains an analysis function of the measurement system according to one embodiment.

Next, an example of the measurement system 2 for measuring a thickness of the edge ring 87 according to an embodiment will be described with reference to FIGS. 3 and 4. FIG. 3 shows an example of the measurement system 2 for measuring the thickness of the edge ring 87 according to the embodiment. FIG. 4 explains an analysis function of the measurement system 2 according to the embodiment.

The measurement system 2 according to the embodiment is configured to measure the thickness of the edge ring 87 that is an example of a measurement object. The measurement system 2 measures the thickness of the edge ring 87 using optical interference. The measurement system 2 includes a light source 110, an optical circulator 111, a focuser 113, a spectroscope 114, and an analyzer 115. The light source 110, the optical circulator 111, the focuser 113, and the spectroscope 114 are connected by an optical fiber cable 112.

The light source 110 is configured to generate measurement light having a wavelength that penetrates the edge ring 87 serving as the measurement object. For example, a super luminescent diode (SLD) is used as an example of the light source 110. The edge ring 87 has an upper surface 87a and a bottom surface 87b. The measurement object may be made of, e.g., $SiO_2$ (quartz), $Al_2O_3$ (sapphire) or the like, other than silicon (Si). Si has a refractive index of 3.4 at a wavelength of 4 μm. $SiO_2$ has a refractive index of 1.5 at a wavelength of 1 μm. $Al_2O_3$ has a refractive index of 1.8 at a wavelength of 1 μm.

The optical circulator 111 is connected to the light source 110, the focuser 113, and the spectroscope 114 through the optical fiber cable 112. The optical circulator 111 is configured to emit the measurement light generated by the light source 110 to the focuser 113 through the optical fiber cable 112.

The focuser 113 is configured to enter the measurement light into the processing chamber 10 through a window portion 40a provided at the upper electrode 40 and emit the measurement light to the upper surface 87a of the edge ring 87. At that time, the focuser 113 emits the measurement light adjusted as parallel light to the edge ring 87, and the reflected light is entered thereto from the edge ring 87. The reflected light includes reflected light Ra from the upper surface 87a and reflected light Rb from the bottom surface 87b. Hereinafter, the system including the focuser 113 and the window portion 40a and configured to input and output a measurement wave D and the reflected lights Ra and Rb will be referred to as "measurement system 2a." The window portion 40a may be made of, e.g., cylindrical quartz having a diameter of 5 mm.

The focuser 113 emits the reflected lights Ra and Rb to the optical circulator 111. The optical circulator 111 emits the reflected light to the spectroscope 114. The spectroscope 114 is configured to measure the spectrum (interference intensity distribution) of the reflected light obtained from the optical circulator 111. The reflected light spectrum shows intensity distribution depending on the wavelength or the frequency of the reflected light.

FIG. 4 is a functional block diagram of the spectroscope 114 and the analyzer 115. The spectroscope 114 includes, e.g., a light dispersion element 116 and a light receiving part 117. The light dispersion element 116 is, e.g., a diffraction grating or the like, and is configured to disperse light at a predetermined dispersion angle for each wavelength. The light receiving part 117 is configured to receive the light dispersed by the light dispersion element 116. As for the light receiving part 117, a charge coupled device (CCD) in which multiple light receiving elements are arranged in a lattice pattern is used. The number of the light receiving elements is the number of samplings. Further, a wavelength span is determined based on the dispersion angle of the light dispersion element 116 and the distance between the light dispersion element 116 and the light receiving elements. Accordingly, the reflected light is dispersed for each wavelength or each frequency, and the intensity is acquired for each wavelength or each frequency. The spectroscope 114 outputs the reflected light spectrum to the analyzer 115.

The analyzer 115 includes an optical-path length calculation unit 118, a driving amount determination unit 71, and a driving amount calibration table 72. The optical-path length calculation unit 118 is configured to calculate an optical-path length nd between the upper surface and the bottom surface of the edge ring 87 in the case that the thickness of the edge ring 87 is set to 'd' based on the reflected light spectrum. The driving amount determination unit 71 is configured to determine the driving amount of the edge ring 87 based on the driving amount calibration table 72 in which the correlation information between the optical-path length and the driving amount of the edge ring 87 is stored.

The analyzer 115 may be a computer. The analyzer 115 may be the same as or different from the control unit 60. In other words, the driving amount of the edge ring 87 may be determined by the analyzer 115 or the control unit 60. Further, the vertical movement of the edge ring 87 may be determined based on the determined driving amount by the analyzer device 115 or the control unit 60.

The optical-path length calculation unit 118 includes a Fourier transform unit 67, a data interpolation unit 68, a center calculation unit 69, and an optical-path length determination unit 70. The Fourier transform unit 67 is configured to perform Fourier transforms on the reflected light spectrum by Fast Fourier Transform (FFT). For example, in the Fourier transform in time domain, the reflected light spectrum representing the intensity distribution depending on the frequency (frequency per unit time) is transformed into a reflected light spectrum representing the intensity distribution depending on time. For example, in the Fourier transform in a spatial domain, the reflected light spectrum representing the intensity distribution depending on a spatial frequency (frequency per unit length) is transformed into a reflected light spectrum representing the intensity distribution depending on a location. The data interpolation unit 68 is configured to interpolate data points within a range including a predetermined peak value of the reflected light spectrum after the Fourier transform. The center calculation unit 69 is configured to calculate a center position of the predetermined peak value of the reflected light spectrum after the Fourier transform. The optical-path length determination unit 70 is configured to calculate the optical-path length based on the center position.

The driving amount determination unit 71 is configured to calculate the thickness d of the edge ring 87 that is the measurement target based on the optical-path length. The driving amount determination unit 71 is further configured to determine a driving amount of the edge ring 87 from the thickness d of the edge ring 87 with reference to the driving amount calibration table 72. The driving amount calibration table 72 is pre-measured data and stores correlation information between the optical-path length of the edge ring 87 and the driving amount.

By using the measurement system configured as described above, a temperature of the edge ring 87 is measured by utilizing optical interference between the upper surface 87a and the bottom surface 87b of the edge ring 87 (FFT frequency domain method). Hereinafter, the principle of the optical interference will be described. As shown in the measurement system 2a of FIG. 3, the measurement light emitted from the light source 110 is used as incident light. An intensity S(k) of the incident light spectrum depends on the spatial frequency 1/λ (frequency per unit length). On the assumption that the wavelength of the light source 110 is λ, the wave number k is 2π/λ. It is assumed that a thickness of the measurement object (edge ring) is denoted by 'd', a refractive index of the measurement object is denoted by 'n' and a reflectivity of the measurement object is denoted by 'R'. The reflected light R is obtained by overlapping a plurality of reflection light components. For example, the reflected light Ra is a reflection light component from the upper surface 87a. The reflected light Rb is a reflection light component from the bottom surface 87b. In addition, the reflected light R includes a reflection light component reflected once from the upper surface 87a and twice from the bottom surface 87b. The other reflection components are omitted. By overlapping the multiple reflection light components, an intensity I(k) of the reflected light spectrum is obtained. The intensity I(k) of the reflected light spectrum and the intensity S(k) of the incident light spectrum have a relationship indicated by the following equation (1).

<Eq. (1)>

$$I(k) \propto \{2R(1-R) - 2R(1-2R)\cos(2nkd) - 2R^2 \cos(4nkd)\} S(k) \quad (1)$$

Figure 5A:
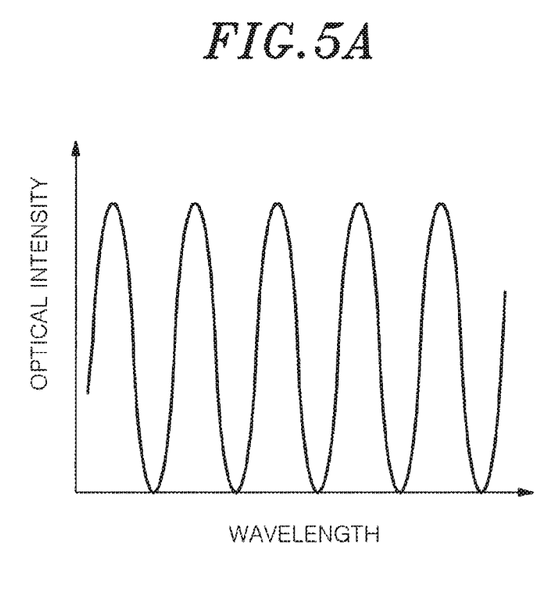
FIGS. 5A and 5B are graphs for explaining intensity distribution of a reflected light spectrum and Fourier transform according to one embodiment.

In Eq. (1), a second term is a term relating to interference between the upper surface 87a on which the reflection occurs once and the bottom surface 87b on which the reflection occurs once. A third term is a term relating to multiple interference between the upper surface 87a and the bottom surface 87b. The graph of FIG. 5A shows an example of the intensity I(k) of the reflected light spectrum of Eq. (1) with respect to the wavelength of the reflected wave on the horizontal axis of the graph of FIG. 5A.

When Fourier transform FFT is applied to Eq. (1), a reflected light spectrum depending on location may be obtained. The spatial frequency 1/λ is transformed to a location x by spatial domain Fourier transform. The intensity I(x) of the reflected light spectrum that is transformed to the location x is as follows by applying Fourier transform to Eq. (1).

<Eq. (2)>

$$I(x) = 2R(1-R) \cdot S(x) - R(1-2R) \cdot \{S(x+2nd) + S(x-2nd)\} - R^2 \cdot \{S(x+4nd) + S(x-4nd)\} \quad (2)$$

Figure 5B:
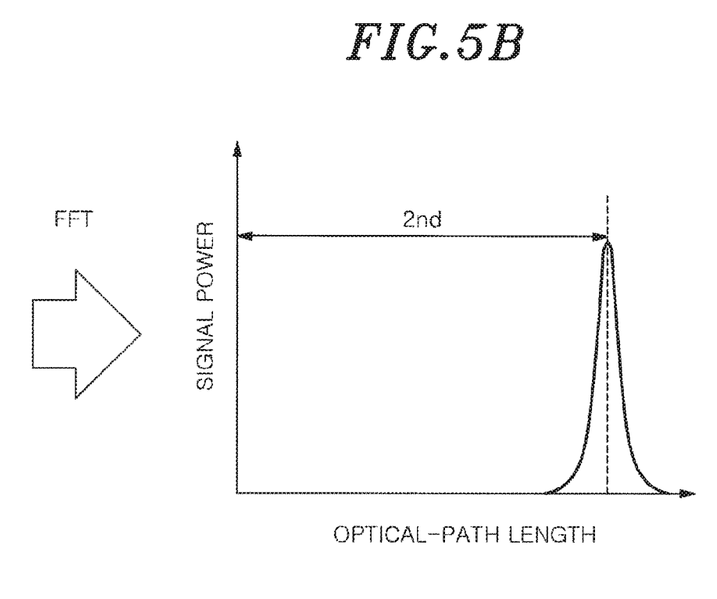

As shown in Eq. (2), a peak value shows at every '2nd'. '2nd' shown in FIG. 5B indicates an optical path difference between the upper surface 87a and the bottom surface 87b of the edge ring 87. In other words, 'nd' indicates the optical-path length between the upper surface 87a and the bottom surface 87b. The driving amount of the edge ring 87 can be calculated by specifying the optical-path length nd from the correlation information between the driving amount and the optical-path length nd in the pre-measured driving amount calibration table 72. Although the spatial domain Fourier transform was used in the above description, the time domain Fourier transform may be used.

<Process of Driving Edge Ring>

Figure 6:
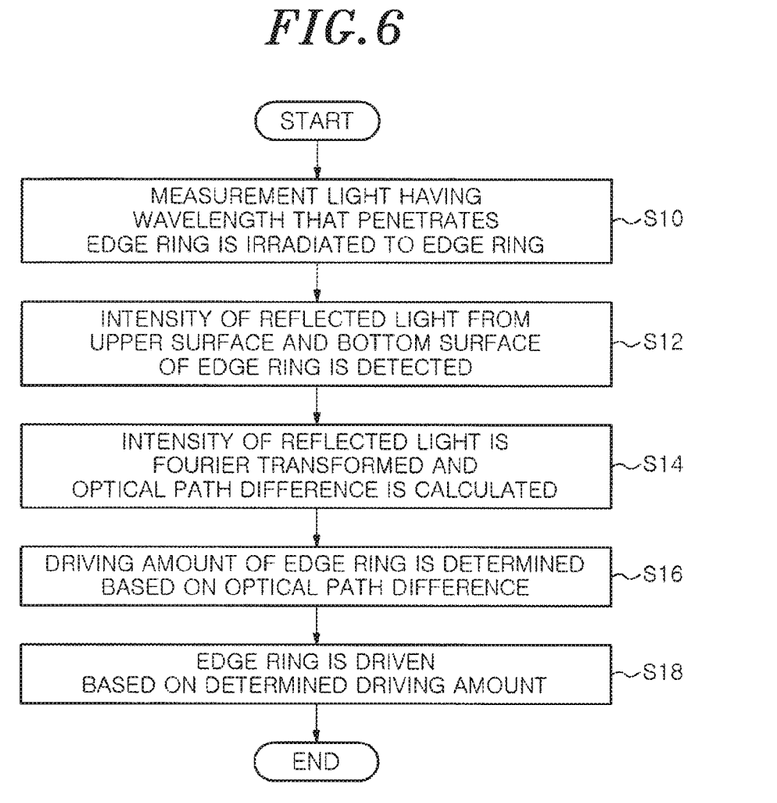
FIG. 6 is a flowchart showing an example of a process of driving an edge ring according to one embodiment.

Next, an example of a process of driving the edge ring 87 according to an embodiment will be described with reference to FIG. 6. FIG. 6 is a flowchart showing an exemplary process of driving the edge ring 87 according to the embodiment.

When the driving process is started, measurement light having a wavelength that penetrates the edge ring 87 is outputted from the light source 110 and irradiated to the edge ring 87 through the optical circulator 111 and the focuser 113 (step S10). Next, the reflected light including the reflected light Ra from the upper surface 87a of the edge ring 87 and the reflected light Rb from the bottom surface 87b of the edge ring 87 are entered to the focuser 113. The focuser 113 emits the reflected light including the reflected light Ra and the reflected light Rb to the spectroscope 114 through the optical circulator 111, and the spectroscope 114 detects the intensity I(k) of the reflected light spectrum and outputs the detected intensity I(k) of the reflected light spectrum to the analyzer 115 (step S12).

Next, the analyzer 115 calculates the optical path difference 2nd between the upper surface 87a and the bottom surface 87b of the edge ring 87 by applying Fourier transforms to the intensity I(k) of the reflected light spectrum (step S14). Next, the analyzer 115 determines the driving amount of the edge ring 87 based on the optical path difference 2nd (step S16).

Next, the control unit 60 receives the driving amount of the edge ring 87 determined by the analyzer 115 and controls the piezoelectric actuator 101 of the moving mechanism 200 to move the edge ring 87 upward or downward based on the driving amount of the edge ring 87 (step S18). Then, the driving process is completed.

The etching rate at the edge portion of the wafer W mainly varies depending on the sheath above the edge ring 87. Therefore, if the height of the edge ring 87 is changed due to its consumption, the height of the sheath above the edge ring 87 is changed, which makes it difficult to control the etching characteristics, e.g., the etching rate or the like, at the edge portion of the wafer W.

In the process of driving the edge ring 87 of the present embodiment, the measurement system 2 can accurately determine the driving amount of the edge ring 87 and drive the edge ring 87. Accordingly, the controllability of the etching characteristics at the edge portion of the wafer W can be enhanced. For example, it becomes possible to suppress the tilting at the edge portion of the wafer W and enhance the controllability of the etching rate at the edge portion of the wafer W.

First Modification

In the above description, the measurement system 2 directly measures the thickness of the central edge ring 87m of the edge ring 87, and the analyzer 115 determines the driving amount of the edge ring 87 based on the consumption amount of the edge ring 87 calculated from the measured thickness of the central edge ring 87m and the initial thickness of the edge ring 87. However, the method of determining the driving amount of the edge ring 87 is not limited thereto. For example, the edge ring 87 that is the measurement target of the measurement system 2 may be an undivided edge ring. In that case as well, the measurement system 2 may measure the thickness of the undivided edge ring 87, and the analyzer 115 may determine the driving amount of the edge ring 87 based on the measured thickness.

Alternatively, the edge ring 87 that is the measurement target of the measurement system 2 may be an edge ring divided into two parts. In that case, the measurement system 2 may measure a thickness of an inner edge ring or an outer edge ring of the edge ring 87, and the analyzer 115 may determine the driving amount of at least one of the inner edge ring and the outer edge ring based on the measured thickness of the inner edge ring or the outer edge ring.

Further, the measurement system 2 may measure the thickness of at least one of the central edge ring 87m, the outer edge ring 87o, and the inner edge ring 87i. In that case, the analyzer 115 may determine the driving amount of at least one of the central edge ring 87m, the outer edge ring 87o, and the inner edge ring 87i based on at least one measured thickness of the central edge ring 87m, the outer edge ring 87o, and the inner edge ring 87i. For example, the measurement system 2 may measure the thickness of the outer edge ring 87o, and the analyzer 115 may determine the driving amount of the central edge ring 87m based on the measured thickness of the outer edge ring 87o.

Although the above descriptions focus on the process of driving the edge ring 87 according to one embodiment, this is merely an example and the present disclosure is not limited thereto. The present disclosure may be applied to a process of driving a member, e.g., the insulator ring 86, the cover ring 89, the top shield ring 41, or the like, through which the wavelength of the measurement light can be penetrated. Further, the measurement light is not limited to infrared light.

Further, the process of driving a member according to one embodiment is not limited to the process of vertically moving the edge ring 87 based on the consumption amount of the edge ring 87. In other words, the process of driving a member according to one embodiment is not limited to the control based on the consumption amount of the edge ring 87, and may be used for the purpose of intentionally adjusting the height of the edge ring 87 based on the processing conditions, for example.

The measurement system 2 may measure the thickness of the member before the loading of the wafer W under predetermined processing conditions or before the loading of a next wafer W upon completion of processing of a predetermined number (one or more) of wafers W. The measurement may be performed at any other times. For example, it is preferable to perform the measurement immediately before the driving of the member, for example.

The driving of the member may be carried out between multiple steps having different processing conditions. In other words, it is possible to drive the member to meet the processing conditions between different plasma processing steps performed in the processing chamber. For example, when a first plasma etching is performed under first processing conditions and a second plasma etching is performed under second processing conditions, the height of the edge ring 87 may be adjusted based on the first processing conditions before the loading of the wafer W. Alternatively, the height of the edge ring 87 may be adjusted based on the second processing conditions after the first plasma etching is performed on the wafer W. Accordingly, it is possible to control the etching characteristics to meet the processing conditions of different plasma processing steps.

Further, it is possible to determine the replacement timing of the member or detect position abnormality of the member by comparing the thickness of the member measured by the measuring system 2 with a predetermined threshold. For example, when the measured thickness of the member is smaller than the threshold, the analyzer 115 may determine that it is necessary to replace the member and notify the control unit 60 of the replacement of the member. Further, for example, when the measured thickness of the member is within the abnormal range, the analyzer 115 may determine that the position of the member is abnormal and notify the control unit 60 of the abnormality. At this time, the control unit 60 may instruct an operator to replace the member.

The analyzer 115 may store a temperature configuration table in which correlation information between the optical-path length and the temperature of the wafer W (or the temperature of the mounting table 20) is stored. In step S16 of FIG. 6, the analyzer 115 may obtain the driving amount of the edge ring 87 corresponding to the measured optical path difference based on the driving amount calibration table 72 and obtain the temperature of the edge ring 87 corresponding to the measured optical path difference based on the temperature configuration table. Accordingly, it is possible to obtain the thickness of the member and the temperature of the member. By using the measurement results of the thickness and the temperature of the member, it is possible to perform the control of the vertical movement of the member and also the control of the etching characteristics at the edge portion of the wafer W in consideration of other conditions.

In the process of driving the member according to the above-described embodiments, as shown in FIG. 3, the focuser 113 is provided at an upper portion of the processing chamber 10, and the measurement system 2a allows the measurement light to be incident on the edge ring 87 from the upper electrode 40. However, the focuser 113 may be provided at a lower portion of the processing chamber 10. In other words, the focuser 113 and the window portion 40a are provided below the mounting table 20, and the focuser 113 irradiates the incident measurement light to the edge ring 87 through the window portion 40a and allows the incidence of the reflected light. The reflected light includes reflected light from the upper surface 87a and reflected light from the bottom surface 87b. In that case as well, it is possible to detect the reflected light and obtain the optical path difference nd between the upper surface and the bottom surface to thereby determine the driving amount of the edge ring 87 from the optical path difference nd.

In the process of driving a member according to the above-described embodiments and in the process of driving a member according to the first modification and a second modification to be described later, the control of the etching characteristics is mainly described. However, the present disclosure is not limited thereto, and the control of characteristics including film formation characteristics at the edge portion of the wafer W may be also carried out.

(Multiple Measurement Systems)

Multiple measurement systems 2a may be provided. For example, the multiple measurement systems 2a may be arranged at equal intervals on a circumference of the member such as the edge ring 87 or the like. In that case, in the step of irradiating the measurement light to the member, the measurement light may be irradiated to multiple portions of the member. In the step of detecting the intensity I(x) of the reflected light, the intensity distribution of the reflected light at each portion may be detected based on the reflected light from an upper surface of each portion of the member and the reflected light from a bottom surface of each portion of the member. In the step of calculating the optical path difference, an optical path difference at each portion may be obtained by applying Fourier transform to a spectrum representing the intensity distribution detected at each portion. In the step of determining the driving amount of the member, the driving amount of the member at each portion may be determined based on the optical path difference calculated at each portion.

In the step of driving the member, at least one of the lifter pins 102 corresponding to the respective portions may be independently driven based on the determined driving amount of the member at each portion.

Since the thickness of the member is measured by the multiple measurement systems 2a, even if a measurement result is not obtained from any one of the measurement systems 2a, the process of driving the member can be performed using the measurement results of the other measurement systems 2a.

Further, for example, when the height of the ring-shaped edge ring 87 is deviated, the height of the edge ring can become uniform by determining the driving amount based on the measurement results of the measurement systems 2a such that the measurement position where the consumption amount of the edge ring 87 is larger becomes higher than the other measurement positions. Accordingly, it is possible to more accurately control the characteristics at the edge portion of the wafer W.

Second Modification

As for the lifter pin 102 shown in FIG. 2, there may be provided multiple lifter pins 102, and the vertical movement thereof may be independently controlled using the moving mechanism 200. Hereinafter, the process of driving the edge ring according to the second modification of the above-described embodiments will be described in detail. In the second modification, the deviation in the arrangement of the wafer W is corrected by individually driving the lifter pins 102 of the edge ring 87 at each position and individually controlling the height of the edge ring 87 at each position.

Figure 7:
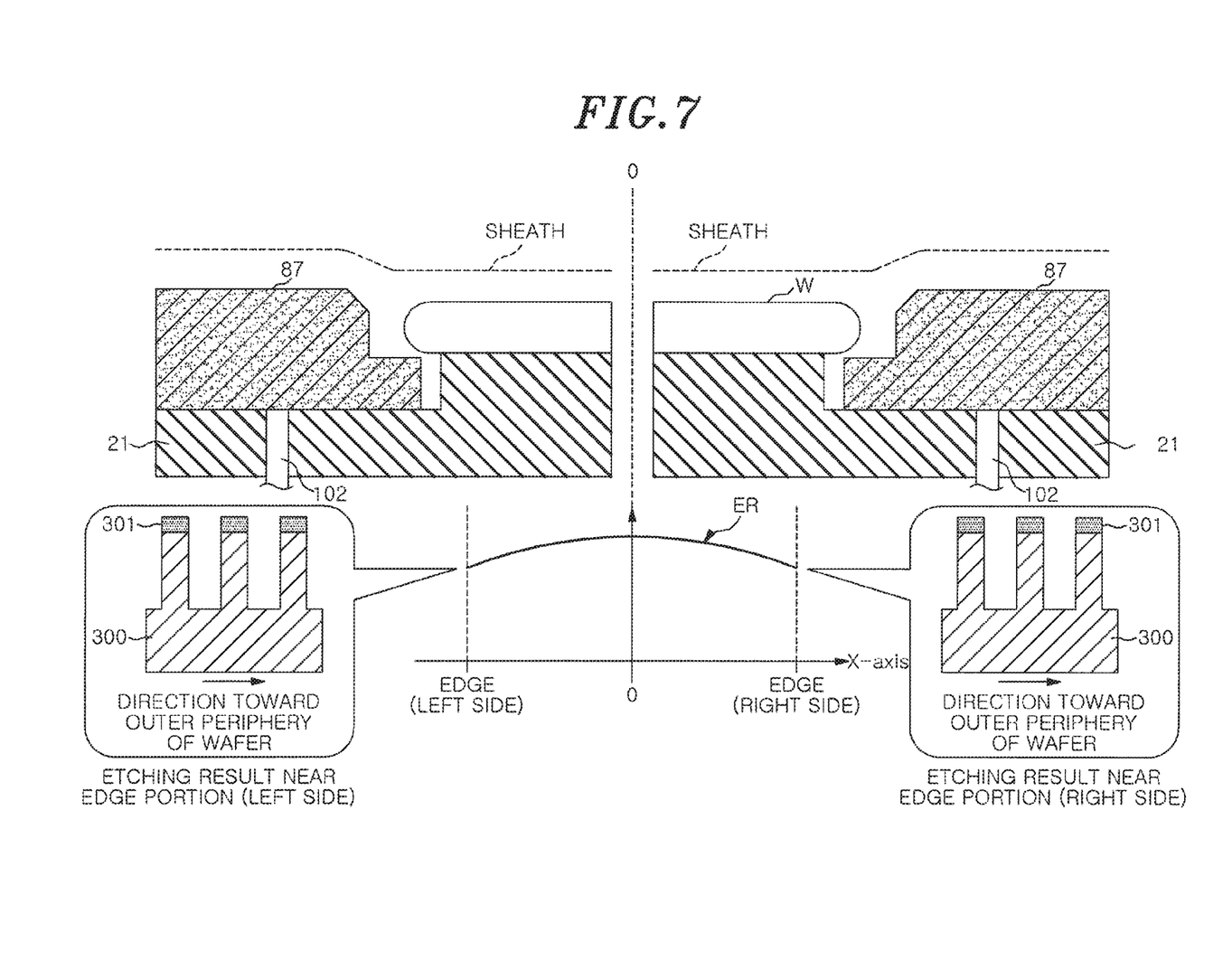
FIG. 7 shows exemplary etching characteristics of an edge portion of a wafer when there is no deviation in arrangement of the wafer according to one embodiment.
Figure 8:
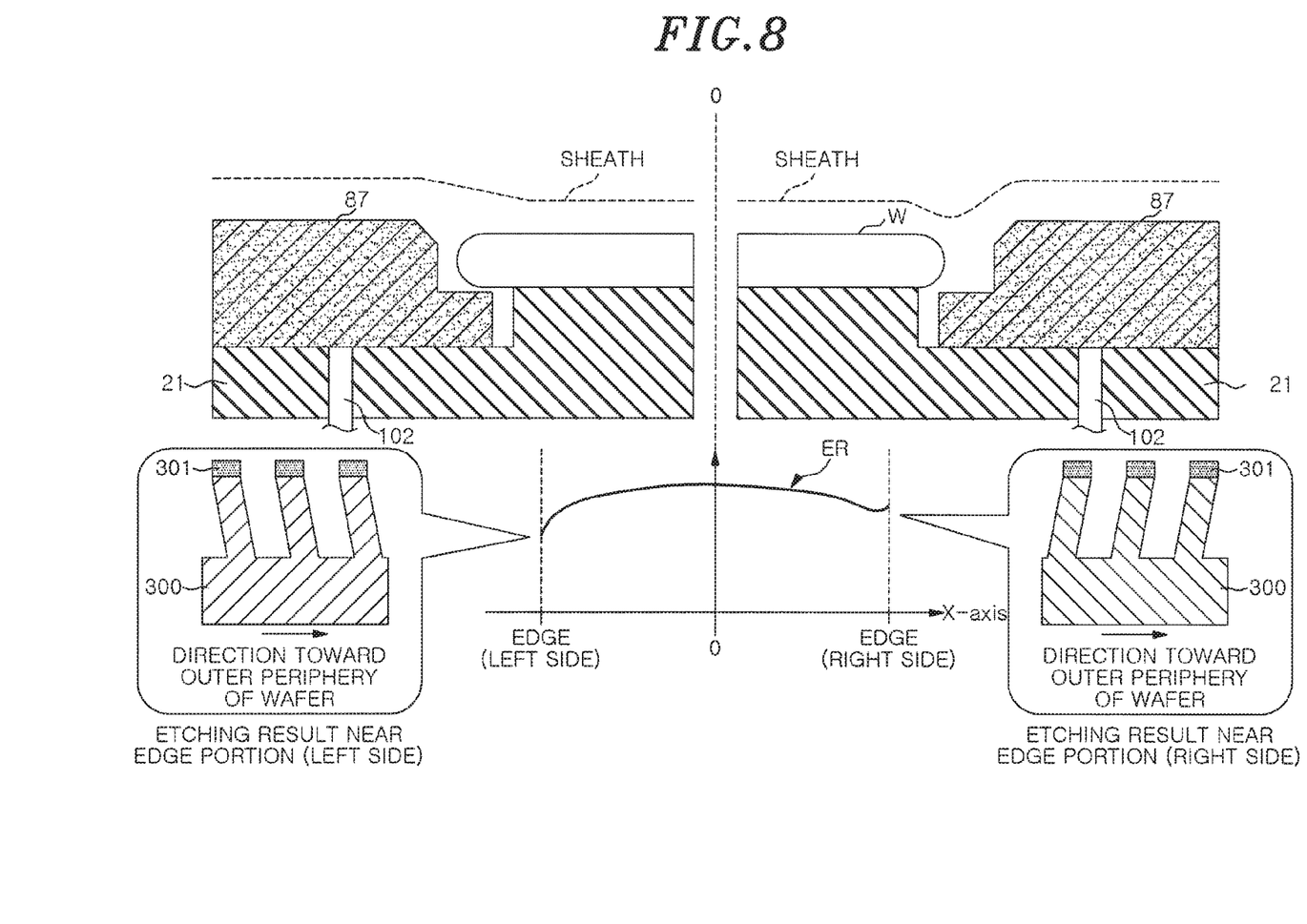
FIG. 8 shows exemplary etching characteristics at the edge portion of the wafer when there is deviation in the arrangement of the wafer according to one embodiment.
Figure 9A:
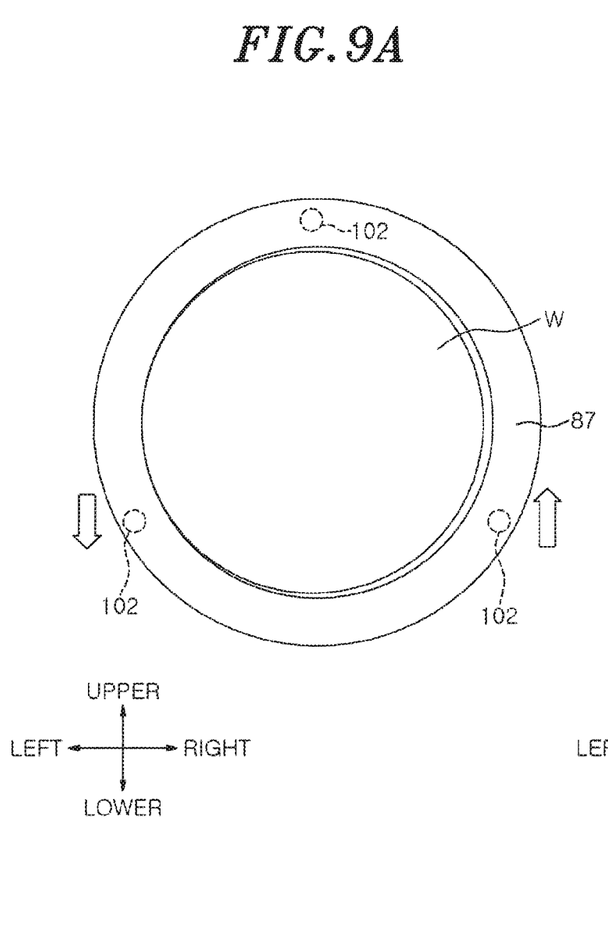
FIGS. 9A and 9B show exemplary deviation in the arrangement of the wafer and exemplary positions of lifter pins according to one embodiment.
Figure 9B:
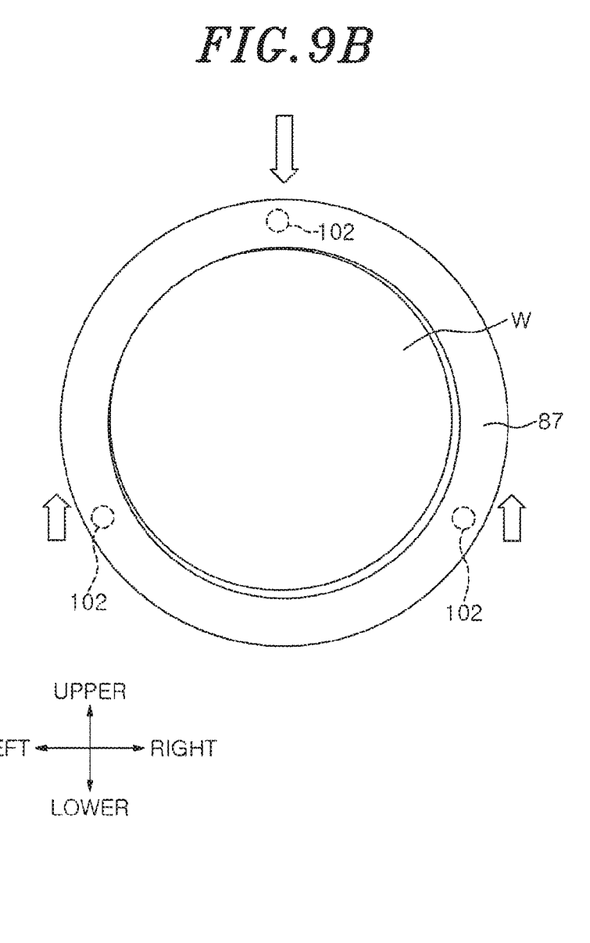
Figure 10:
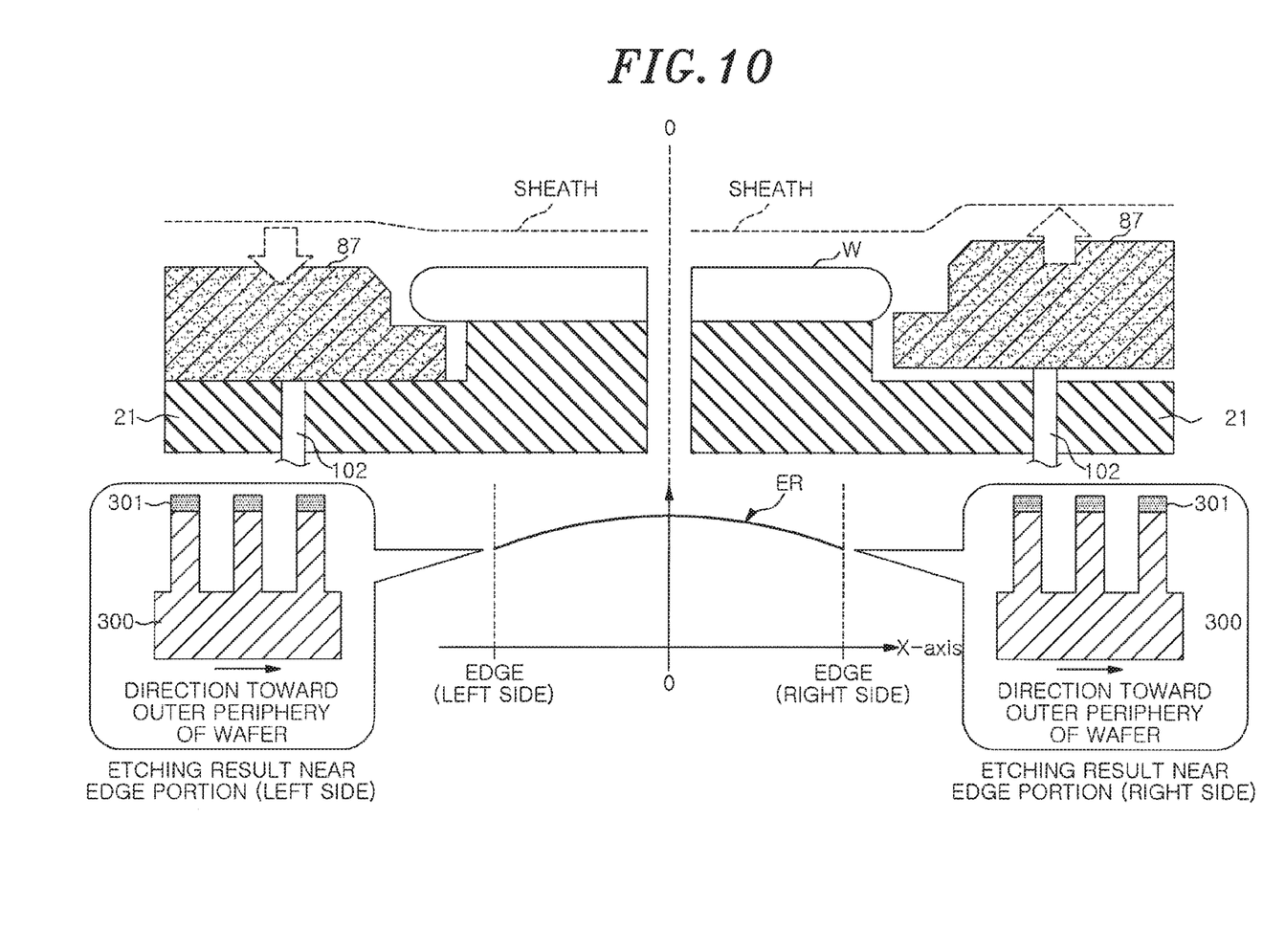
FIG. 10 shows an exemplary case of driving an edge ring by individual lifter pins according to one embodiment.

FIG. 7 shows exemplary etching characteristics at the edge portion of the wafer W when there is no deviation in the arrangement of the wafer W according to one embodiment. FIG. 8 shows exemplary etching characteristics at the edge portion of the wafer W when there is deviation in the arrangement of the wafer W according to one embodiment. FIGS. 9A and 9B show exemplary deviation in the arrangement of the wafer W and the positions of the lifter pins 102 according to one embodiment. FIG. 10 shows an exemplary case of driving of the edge ring 87 by individually controlling the lifter pins 102 according to one embodiment.

As shown in FIG. 7, when there is no deviation in the arrangement of the wafer W, i.e., when the wafer W is mounted substantially concentrically with a central axis O of the mounting surface of the electrostatic chuck 21, the etching characteristics at the edge portion of the wafer W are not different between the left side and right side (and between the upper side and the lower side) of the wafer W. For example, as shown in FIG. 7, the etching rate ER or the etching shape are not different from each other between edge portions on the left side and the right side of the wafer W. This is also true for edge portions on the upper side and the lower side of the wafer W.

However, as shown in FIG. 8, when there is deviation in the arrangement of the wafer W, the etching characteristics at the edge portion of the wafer W vary due to the deviation. For example, when the wafer W is deviated to the left side with respect to the central axis O as shown in FIG. 8, the etching rate ER is different from each other between edge portions on the left side and the right side of the wafer W. Since the wafer W is deviated to the left side with respect to the central axis O in the example of FIG. 8, a dent is formed on the sheath near the right end portion of the wafer W (that is, the height of the sheath near the right end portion of the wafer W is lowered). This causes tilting in an etching shape of an etching target film 300, which makes it difficult to maintain the vertical etching shape. The consumption amount of the edge ring 87 also varies depending on the position of the edge ring 87.

Conventionally, in order to solve such deviation of the wafer W, the wafer W is re-centered for re-arrangement, or the edge ring 87 is horizontally moved depending on the mounting position of the wafer W in a structure in which the edge ring 87 is movable. However, any of the above solutions requires time to perform the positioning and, thus, the productivity deteriorates.

Therefore, in the second modification, the consumption amount of the edge ring 87 at each position is measured, and the driving amount of the edge ring at each position is determined from each measurement result. Accordingly, the variation in the etching rate ER or the etching shape due to the deviation of the wafer W can be corrected.

For example, as shown in FIGS. 9A and 9B, three lifter pins 102 may be configured to bring into contact with the bottom surface of the edge ring 87 at equal intervals. The number of the lifter pins 102 is not limited to three, and may be plural.

The control unit 60 independently controls the lifter pins 102 to drive the edge ring 87 upward or downward in the height direction based on the measurement result of the position of the wafer W. For example, in the case shown in FIG. 9A, the wafer W is deviated to the left side of FIG. 9A. In that case, the control unit 60 moves one of the lifter pins 102 on a left lower side of FIG. 9A vertically downward and moves one of the lifter pin 102 on a right lower side of FIG. 9A vertically upward. One of the lifter pins 102 on the upper center of FIG. 9A is not moved.

Accordingly, as shown in FIG. 10, the right side of the edge ring 87 becomes higher than the left side of the edge ring 87 so that the height of the sheath can be adjusted. As a result, it is possible to eliminate the difference in the etching rate ER between the right side and the left side of the edge ring 87 and maintain the vertical etching shape of the etching target film 300.

In the case shown in FIG. 9B, the wafer W is deviated to the upper side of FIG. 9B. In that case, the control unit 60 moves one of the lifter pins 102 on the upper center of FIG. 9B vertically downward. Further, the control unit 60 moves the lifter pins 102 on the left lower side and the right lower side of FIG. 9B vertically upward by a moving amount having an absolute value smaller than that of the moving amount of the lifter pin 102 on the upper center of FIG. 9B. Accordingly, the edge ring 87 on the lower side of FIG. 9B becomes higher than the edge ring 87 on the upper side of FIG. 9B, and the height of the sheath can be adjusted. As a result, it is possible to eliminate the difference in the etching rate ER between the upper side and the lower side of the edge ring 87 shown in FIG. 9B and maintain the vertical etching shape of the etching target film 300.

In the above description, the method of driving the edge ring 87 has been described. However, the driving target is not limited to the edge ring 87, and may be the insulator ring 86, the cover ring 89, the top shield ring 41, or the like.

In accordance with the second modification, the method of driving a member provided in a processing chamber includes: measuring the position of the wafer W mounted on the mounting table 20; determining a driving amount of the member based on the deviation of the wafer W; and independently driving at least one of the lifter pins 102 for moving the member vertically upward or downward based on the determined driving amount.

By controlling the vertical movement the edge ring 87, the height of the sheath above the edge ring 87 can be controlled in the circumferential direction. Accordingly, even when the gap between the inner periphery of the edge ring 87 and the outer periphery of the wafer W is not uniform, the height of the sheath above the edge portion of the wafer W can be made uniform or adjusted. As a result, it is possible to control the etching characteristics such as the etching rate at the edge portion of the wafer W or the etching shape.

As described above, in accordance with the method of driving a member according to the embodiments and the first and second modifications, it is possible to drive the member while accurately determining the driving amount of the member. Further, in accordance with the method for driving a member according to the second modification, when the wafer W is deviated from the center of the mounting table, the variation in the etching characteristics such as the etching rate and the like due to the deviation of the wafer W can be corrected by independently controlling multiple driving positions of the member in the height direction.

The method of driving a member and the processing apparatus according to the embodiments and the modifications of the present disclosure are examples in all respects and are not limited. The above-described embodiments and the modifications can be variously changed and modified without departing from the scope and spirit of the appended claims. The contents described in the above-described embodiments may include other configurations without contradicting each other and may be combined without contradicting each other.

The processing apparatus of the present disclosure can be applied to the various processing apparatuses using capacitively coupled plasma (CCP), inductively coupled plasma (ICP), a radial line slot antenna, electron cyclotron resonance plasma (ECR), helicon wave plasma (HWP), and the like.

In the present disclosure, the wafer W has been described as an example of the substrate. However, the substrate is not limited thereto, and may be various substrates used for a liquid crystal display (LCD), a flat panel display (FPD), a CD substrate, a printed circuit board, and the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A method for driving a member provided in a processing chamber, comprising:
   irradiating measurement light having a wavelength that penetrates the member to the member;
   detecting an intensity distribution of reflected light based on reflected light from an upper surface of the member and reflected light from a bottom surface of the member;
   calculating an optical path difference by applying Fourier transform to a spectrum representing the intensity distribution;
   determining a driving amount of the member based on the optical path difference; and
   driving the member based on the determined driving amount.

2. The method of claim 1, wherein the member is a consumable member.

3. The method of claim 2, wherein the consumable member is at least one of an edge ring, an insulator ring, a cover ring and a top shield ring.

4. The method of claim 3, wherein the consumable member is the edge ring and the edge ring is divided into multiple parts, and
   said driving the member includes:
   driving at least one of the multiple parts of the edge ring based on the determined driving amount.

5. The method of claim 1, wherein in said irradiating the measurement light, the measurement light is irradiated to multiple portions of the member provided in the processing chamber,
   in said detecting the intensity distribution, the intensity distribution of reflected light at each of the multiple portions is detected based on reflected light from an upper surface of each of the multiple portions of the member and reflected light from a bottom surface of each of the multiple portions of the member,
   in said calculating the optical path difference, the optical path difference at each of the multiple portions is calculated by applying Fourier transform to a spectrum representing the detected intensity distribution at each of the multiple portions,
   in said determining the driving amount of the member, the driving amount of the member at each of the multiple portions is determined based on the optical path difference at each of the multiple portions.

6. The method of claim 5, wherein multiple lifter pins are provided to be in contact with the member,
   in said determining the driving amount of the member, the driving amount of the member at each of the multiple portions is determined based on the optical path difference at each of the multiple portions, and
   in said driving the member, at least one of the lifter pins corresponding to the respective multiple portions is individually driven based on the determined driving amount of the member at each of the multiple portions.

7. The method of claim 6, wherein in said determining the driving amount of the member, a consumption amount of the member at each of the multiple portions is measured based on the optical path difference obtained at each of the multiple portions, and the driving amount of the member at each of the multiple portions is determined from each of the measurement results.

8. The method of claim 5, wherein in said irradiating the measurement light, the measurement light is irradiated to another member different from the member provided in the processing chamber, and the measurement light is irradiated to multiple portions of said another member, in said driving the member, said another member is driven based on a determined driving amount of said another member at each of the multiple portions.

9. The method of claim 1, wherein in said irradiating the measurement light, the measurement light is irradiated to another member different from the member provided in the processing chamber, and in said driving the member, said another member is driven based on a determined driving amount of said another member.

10. The method of claim 1, wherein in said irradiating the measurement light, the measurement light is irradiated from the upper or the bottom of the member.

11. The method of claim 1, wherein the method for driving the member is performed between different plasma processes performed in the processing chamber.

12. The method of claim 1, further comprising:

creating a driving amount calibration table storing correlation information between the optical path difference and the driving amount of the member, wherein, in said determining the driving amount, the driving amount of the member is determined, with reference to the driving amount calibration table, from a thickness of the member calculated based on the optical path difference.

13. The method of claim 1, wherein the method for driving the member is performed before a loading of a substrate to be processed or before a loading of a subsequent substrate to be processed upon completion of processing of a predetermined number of substrates in a plasma process performed under predetermined conditions.

14. The method of claim 1, wherein said irradiating the measurement light, said detecting the intensity distribution, said calculating the optical path difference and said determining the driving amount of the member are performed immediately before said driving the member.

15. The method of claim 1, wherein the member is an edge ring divided into an inner edge ring and an outer edge ring, the method further includes determining a thickness of the inner edge ring or the outer edge ring based on the optical path difference, the determining of the driving amount of the member includes determining a driving amount of the inner edge ring and/or the outer edge ring based on the determined thickness of the inner edge ring or the outer edge ring, and the driving of the member includes driving the inner edge ring and/or the outer edge ring based on the determined driving amount of the inner edge ring and/or the outer edge ring.

16. The method of claim 1, wherein the member is an edge ring divided into a central edge ring, an outer edge ring, and an inner edge ring, the method further includes determining a thickness of at least one selected from the group consisting of the central edge ring, the outer edge ring, and the inner edge ring based on the optical path difference, the determining of the driving amount of the member includes determining a driving amount of at least one selected from the group consisting of the central edge ring, the outer edge ring, and the inner edge ring based on the determined thickness of at least one selected from the group consisting of the central edge ring, the outer edge ring, and the inner edge ring, and the driving of the member includes driving the at least one selected from the group consisting of the central edge ring, the outer edge ring, and the inner edge ring based on the determined driving amount of the at least one selected from the group consisting of the central edge ring, the outer edge ring, and the inner edge ring.

* * * * *